(12) United States Patent
Yendluri et al.

(10) Patent No.: US 10,361,711 B1
(45) Date of Patent: *Jul. 23, 2019

(54) STUB FILTERS TO IMPROVE BLOCKER TOLERANCE IN CONTINUOUS-TIME RESIDUE GENERATION ANALOG-TO-DIGITAL CONVERTERS

(71) Applicant: Analog Devices International Unlimited Company, Limerick (IE)

(72) Inventors: Shanthi Pavan Yendluri, Chennai (IN); Hajime Shibata, Toronto (CA); Christopher W. Mangelsdorf, Encinitas, CA (US)

(73) Assignee: ANALOG DEVICES GLOBAL UNLIMITED COMPANY, Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 16/219,198

(22) Filed: Dec. 13, 2018

(51) Int. Cl.
*H03M 1/12* (2006.01)
*H03M 1/10* (2006.01)
*H03M 1/06* (2006.01)
*H03M 1/18* (2006.01)
*H03M 1/00* (2006.01)

(52) U.S. Cl.
CPC .......... *H03M 1/1245* (2013.01); *H03M 1/001* (2013.01); *H03M 1/06* (2013.01); *H03M 1/10* (2013.01); *H03M 1/18* (2013.01)

(58) Field of Classification Search
CPC ............ H03M 1/12; H03M 1/06; H03M 1/10; H03M 1/001; H03M 1/18
USPC .................... 341/155, 120, 118, 110, 139
See application file for complete search history.

(56) References Cited

U.S. PATENT DOCUMENTS

| 5,206,647 | A | 4/1993 | Stone |
| 7,289,053 | B2 | 10/2007 | Bunin |
| 8,896,475 | B2 | 11/2014 | Shibata |
| 9,312,840 | B2 | 4/2016 | Dong et al. |
| 9,621,175 | B2 | 4/2017 | Pagnanelli |

(Continued)

FOREIGN PATENT DOCUMENTS

EP 283296 5/1990

OTHER PUBLICATIONS

U.S. Appl. No. 15/794,367, filed Oct. 26, 2017, Reducing Residue Signals in Analog-to-Digital Converters.

(Continued)

*Primary Examiner* — Joseph J Lauture
(74) *Attorney, Agent, or Firm* — Patent Capital Group

(57) ABSTRACT

Residue generation systems for use in continuous-time and hybrid ADCs are disclosed. An example residue generation system includes at least one stub filter, configured to generate a modified analog input based on an analog input, and a quantizer, configured to generate a digital input to a feedforward DAC based on the modified analog input generated by the filter. The feedforward DAC is configured to generate a feedforward path analog output based on the digital input generated by the quantizer, and the system may further be configured to generate a residue signal based on the feedforward path analog output. Providing one or more stub filters that filter the analog input before it is quantized by the quantizer advantageously allows blockers to be attenuated before they are sampled and aliased by the quantizer.

27 Claims, 9 Drawing Sheets

(56) References Cited

U.S. PATENT DOCUMENTS

| | | | |
|---|---|---|---|
| 10,187,075 B1* | 1/2019 | Patil | H03M 1/001 |
| 2005/0053126 A1 | 3/2005 | Balamurugan et al. | |
| 2005/0275577 A1 | 12/2005 | Bjornsen | |
| 2013/0136282 A1 | 5/2013 | McClain | |
| 2014/0168000 A1 | 6/2014 | Lemkin | |
| 2016/0373101 A1 | 12/2016 | Dong et al. | |
| 2017/0317860 A1 | 11/2017 | Bolatkale et al. | |

OTHER PUBLICATIONS

U.S. Appl. No. 15/974,548, filed May 8, 2018, Blocker Tolerance in Continuous-Time Residue Generating Analog-to-Digital Converters.

José Franca et al., Multirate Analog-Digital Systems for Signal Processing and Conversion, 0018-9219/97 © 1997 IEEE, Proceedings of the IEEE, vol. 85, No. 2, Feb. 1997, 21 pages.

Jurgen Deveugele et al., Parallel-Path Digital-to-Analog Converters for Nyquist Signal Generation, 0018-9200/04, © 2004 IEEE, IEEE Journal of Solid-State Circuits, vol. 39, No. 7, Jul. 2004, 10 pages.

Paul T.M. van Zeijl et al., On the Attenuation of DAC Aliases Through Multiphase Clocking, 1549-7747 © 2009 IEEE, IEEE Transactions on Circuits and Systems—II: Express Briefs, vol. 56, No. 3, Mar. 2009, 5 pages.

Karthikeyan Reddy et al., a 16-mW 78-dB SNDR 10-MHz BW CT ΔΣ ADC Using Residue-Cancelling VCO-Based Quantizer, 0018-9200 © 2012 IEEE, IEEE Journal of Solid-State Circuits, vol. 47, No. 12, Dec. 2012, 12 pages.

Amrith Sukumaran et al., Low Power Design Techniques for Single-Bit Audio Continuous-Time Delta Sigma ADCs Using FIR Feedback, 0018-9200 © 2014 IEEE, IEEE Journal of Solid-State Circuits, vol. 49, No. 11, Nov. 2014, 11 pages.

Yunzhi Dong et al., A Continuous-Time 0-3 MASH ADC Achieving 88 dB DR With 53 MHz BW in 28 nm CMOS, 0018-9200 © 2014 IEEE, IEEE Journal of Solid-State Circuits, vol. 49, No. 12, Dec. 2014, 10 pages.

Yunzhi Dong et al., A 72 dB-DR 465 MHz-BW Continuous-Time 1-2 MASH ADC in 28 nm CMOS, 1558-173X © 2016 IEEE, IEEE Journal of Solid-State Circuits, vol. 51, No. 12, Dec. 2016, 11 pages.

Hajime Shibata et al., A 9GS/s 1GHz-BW Oversampled Continuous-Time Pipeline ADC Achieving—161dBFS/Hz NSD, ISSCC 2017, Session 16, Gigahertz Data Converters, 16.2, 2017 IEEE International Solid-State Circuits Conference, 978-1-5090-3758-2/17 © 2017 IEEE, 3 pages.

Will Yang, *CT Pipeline Front-end Matching*, Jan. 19, 2017, 6 pages.

Mohamed Abouzied et al., A Process-Tolerant Out-of-Band Blocker Rejection Technique for SAW-less Receivers, Microelectronics Journal 45 (2014) 4 pages.

B. Bakkaloglu et al., Chapter 2, Design of Power, Dynamic Range, Bandwidth and Noise Scalable ADCs, Springer-Verlag, Berlin Heidelberg 2014, 54 pages.

Morgan et al., *Reflectionless Filter Structures*, IEEE Transactions on Microwave Theory and Techniques, vol. 63, No. 4, Apr. 2015, 9 pages.

Stearns, *Transmission Line Filters Beyond Stubs and Traps*, ARRL Pacificon Antenna Seminar, Santa Clara, CA, USA, Oct. 12-14, 2012, 123 pages.

Wang et al., *A Digital Filtering ADC with Programmable Blocker Cancellation for Wireless Receivers*, IEEE Journal of Solid-State Circuits, vol. 53, No. 3, Mar. 2018, 11 pages.

Chemandy Electronics, *How Does a Stub Filter Work?*, http://chemandy.com/technical-articles/sub-filter/how-does-a-stub-filter-work.htm, Nov. 20, 2018, 18 pages.

Darvishi et al., *Design of Active N-Path Filters*, IEEE Journal of Solid-State Circuits, vol. 48, Issue 12, Dec. 2013, 16 pages.

MMIC Reflectionless Filters, www.minicircuits.com, Brooklyn, NY, USA, 5 pages.

Stub (electronics)—Wikipedia, downloaded from the Internet Nov. 21, 2018, http://en.wikipedia.org/wiki/Stub_(electronics), 4 pages.

*The Quarter-Wave Stub*, http://www.articpeak.com/antennapages/quarterwavestub.html, downloaded from the internet Nov. 21, 2018, 1 page.

Professor Tzong-Lin Wu, *Transmission Line Basics*, NTU, EMC Lab, downloaded from the internet on Nov. 21, 2018, 89 pages.

* cited by examiner

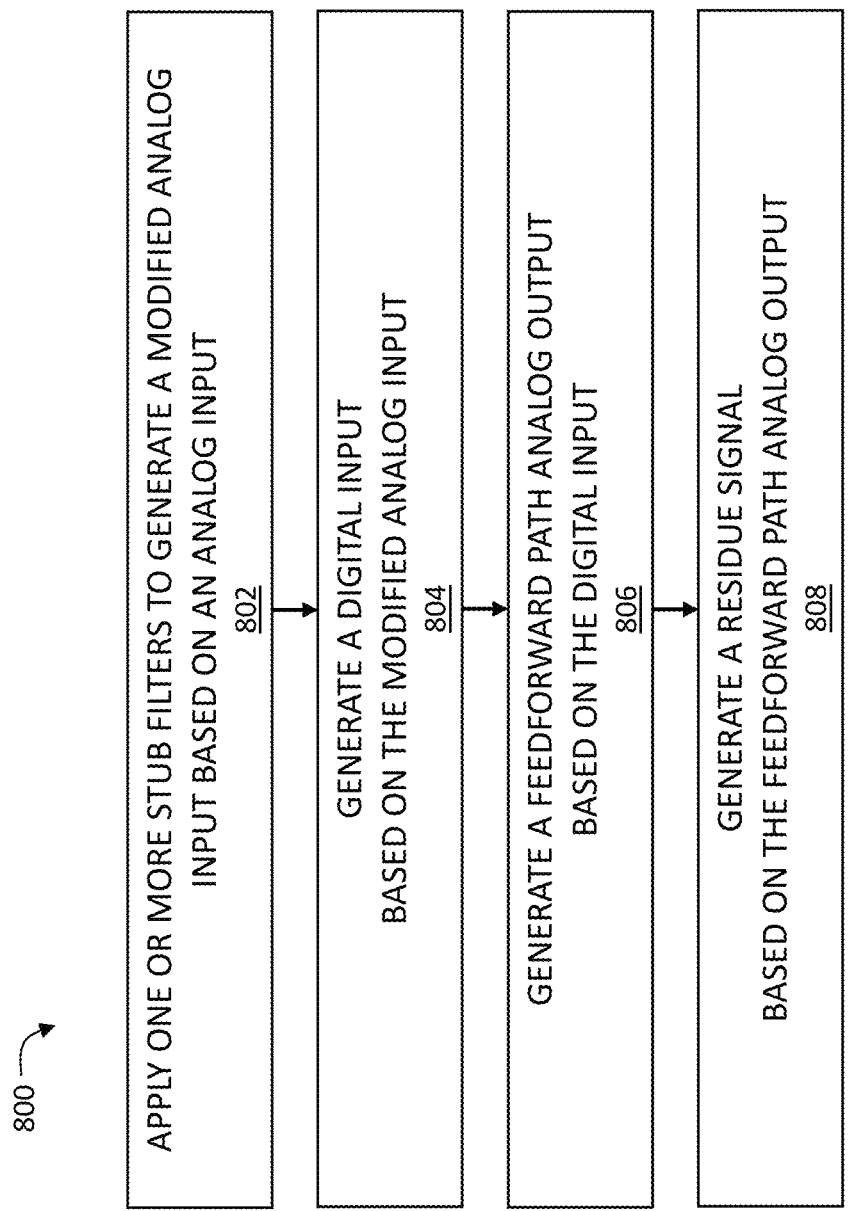

STUB FILTERS TO IMPROVE BLOCKER TOLERANCE IN CONTINUOUS-TIME RESIDUE GENERATION ANALOG-TO-DIGITAL CONVERTERS

TECHNICAL FIELD OF THE DISCLOSURE

The present disclosure relates generally to analog-to-digital converters and, more particularly, to analog-to-digital converters that employ continuous-time residue generation.

BACKGROUND

Real-world analog signals such as temperature, pressure, sound, or light are routinely converted to a digital representation that can be easily processed in modern digital signal processing systems. The circuits that perform this conversion of an analog input signal to a digital output signal are referred to as analog-to-digital converters (ADCs). ADCs can translate analog electrical signals representing real-world phenomena such as temperature, pressure, sound, or light to digital signals for data processing purposes.

ADCs can be found in many places such as broadband communication systems, audio systems, receiver systems, etc., and are used in a broad range of applications including communications, energy, healthcare, instrumentation and measurement, motor and power control, industrial automation and aerospace/defense. For example, an antenna may generate an analog signal based on the electromagnetic waves carrying information/signals in the air. The analog signal generated by the antenna may then be provided as an input to an ADC to generate a digital output signal for further processing. In another example, in precision measurement systems, electronics may be provided with one or more sensors to make measurements, and these sensors may generate an analog signal. The analog signal may then be provided to an ADC as an input to generate a digital output signal for further processing.

Designing an ADC is a non-trivial task because each application may have different needs in speed, performance, power, cost and size. As the applications needing ADCs grow, the need for accurate and reliable conversion performance also grows.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 8 is a flow diagram illustrating a method for generating a residue signal, according to some embodiments of the present disclosure.

DESCRIPTION OF EXAMPLE EMBODIMENTS OF THE DISCLOSURE

Overview

Figure 1A:
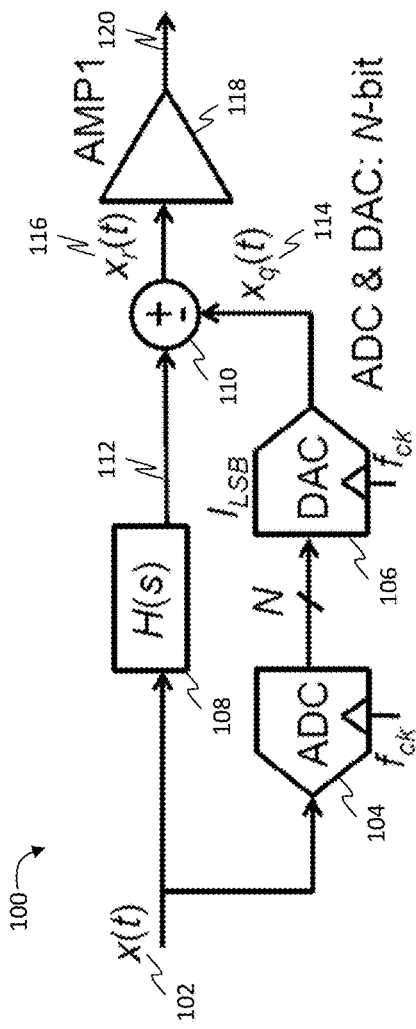
FIG. 1A is an illustrative system diagram of a conventional continuous-time residue generation system.

Continuous-time (CT) residue generation systems are increasingly popular in high-performance and high-speed ADCs, partly due to their inherent anti-aliasing and their potential to achieve high sampling rates. The anti-aliasing performance in such systems, however, is contingent upon the amplitude levels of the applied out-of-band blockers being low (where, as used in the art, the term "blocker" refers to any signal that is present outside the bandwidth where desired signals lie). Large blockers can result in residue signals (or, simply, "residues") that exceed the full-scale of the ADC, overload the ADC, and worsen its performance. Therefore, blocker tolerance, quantified e.g. in terms of the largest blocker amplitude that an ADC is able to support without suffering negative consequences, of such ADCs is limited to low values.

Embodiments of the present disclosure provide mechanisms for using stub filters to improve blocker tolerance of ADCs that employ CT residue generation systems. Mechanisms described herein may be applicable to CT as well as hybrid (i.e. part CT, part discrete-time (DT)) ADCs and may be implemented in ADCs of various types of architectures, such as e.g. pipelined ADCs, multi-stage noise shaping (MASH) ADCs, voltage controller oscillator (VCO) ADCs, and other ADCs utilizing generation and processing of residue signals. Some of the mechanisms described herein may be especially attractive for high-performance and high-speed converter applications. One aspect of the present disclosure provides a residue generation system for use in a CT stage of an ADC, the system including at least one stub filter, configured to generate a modified analog input based on an analog input to the filter (or to the residue generation system), and a quantizer, configured to generate a digital input to a feedforward DAC based on the modified analog input generated by the filter. The feedforward DAC is configured to generate a feedforward path analog output based on the digital input generated by the quantizer, and the system may further be configured to generate a residue signal based on the feedforward path analog output. Providing one or more stub filters that filter the analog input before it is quantized advantageously allows blockers to be attenuated before they are sampled and aliased by the quantizer. Additionally, at least some of the residue generation systems described herein may be implemented with relatively small design and power dissipation overheads.

The systems, methods and devices of this disclosure each have several innovative aspects, no single one of which is solely responsible for the all of the desirable attributes disclosed herein. Details of one or more implementations of the subject matter described in the present disclosure are set forth in the description below and the accompanying drawings.

As will be appreciated by one skilled in the art, at least some aspects of the present disclosure, in particular at least some aspects of residue generation that involves applying one or more stub filters before quantization takes place, as described herein, may be embodied in various manners— e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." At least some functions described in this disclosure may be implemented as an algorithm executed by one or more hardware processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to the existing devices and systems (e.g. to the existing ADCs and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Various aspects of the illustrative embodiments are described using terms commonly employed by those skilled in the art to convey the substance of their work to others skilled in the art. The terms "substantially," "approximately," "about," etc., may be used to generally refer to being within +/−20% of a target value based on the context of a particular value as described herein or as known in the art.

Other features and advantages of the disclosure will be apparent from the following description and the claims.

Basics of ADCs and Challenges with Residue Signals

ADCs are electronic devices that convert a continuous physical quantity carried by an analog signal to a digital number that represents the quantity's amplitude (or to a digital signal carrying that digital number). The conversion involves quantization of the analog input signal, i.e. a process of mapping input values from a continuous set of analog values to output values in a countable smaller set of digital values, so it would introduce a small amount of error. Typically the quantization occurs through periodic sampling of the analog input signal. The result is a sequence of digital values (i.e., a digital signal) that represents conversion of a CT and continuous-amplitude analog input signal to a DT and discrete-amplitude digital signal. An ADC can be defined by the following application requirements: its bandwidth (the range of frequencies of analog signals it can properly convert to a digital signal) and its resolution (the number of discrete levels the maximum analog signal can be divided into and represented in the digital signal). An ADC also has various specifications for quantifying ADC dynamic performance, including signal to noise ratio (SNR), signal-to-noise-and-distortion ratio (SINAD), effective number of bits (ENOB), total harmonic distortion (THD), total harmonic distortion plus noise (THD+N), and spurious free dynamic range (SFDR). ADCs have many different designs, which can be chosen based on the application requirements and performance specifications.

As described above, ADCs based on CT residue generation systems are increasingly popular in various applications. An example of a conventional CT residue generation system 100 is shown in FIG. 1A. As shown in FIG. 1A, a CT analog input, x(t), 102 is sent to two different paths. A first path, which may be described as a "feedforward" path, includes a cascade of a quantizer 104 and a feedforward DAC 106. A second path, which may be described as a "forward" path, includes a CT analog transfer function, H(s), 108. The CT analog input x(t) 102 is applied to the CT analog transfer function H(s) 108 in the forward path and to a cascade of the N-bit ADC implementing the quantizer 104 and an N-bit DAC implementing the feedforward DAC 106, clocked at a sampling rate of $f_{ck}$ in the feedforward path. A subtractor 110 then subtracts the output 112 of the transfer function H(s) 108 from the output, $x_q(t)$, 114 of the DAC 106 to generate a residue signal, $x_r(t)$, 116. This residue signal may then be processed, e.g. filtered and amplified by an amplifier, $AMP_1$, 118, and the processed residue signal 120 may be provided to subsequent stages in an ADC (not shown in FIG. 1A).

Figure 1B:
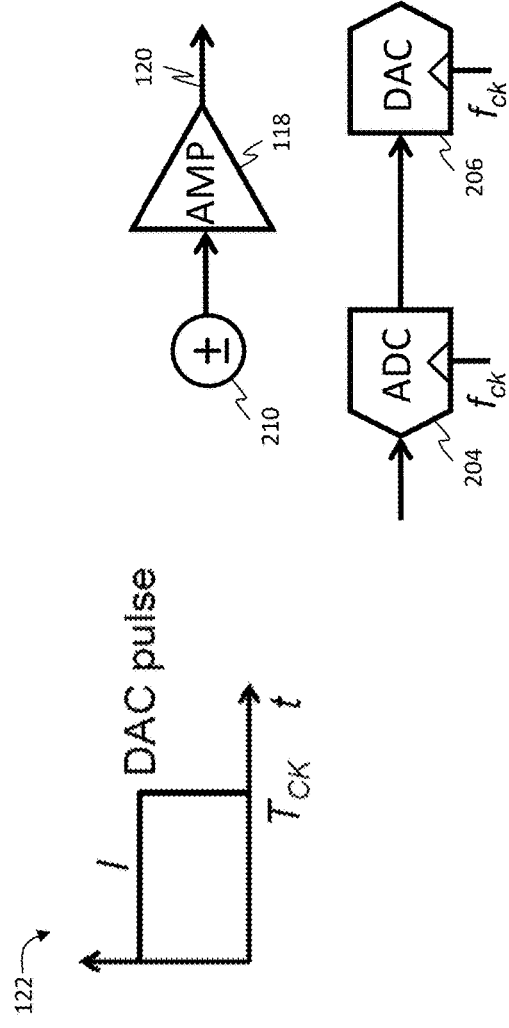
FIG. 1B is an illustration of a non-return-to-zero digital-to-analog converter (DAC) pulse.

Oftentimes, e.g. in the case of CT pipelined ADCs, the transfer function H(s) 108 is the transfer function of a CT analog delay. The feedforward DAC 106 is usually a non-return-to-zero (NRZ) DAC, and can be either in voltage- or current-mode, but is typically the latter. In such a case, the DAC 106 outputs an NRZ current pulse, an example of which is shown in FIG. 1B as a DAC pulse 122, that lasts for a clock period, $T_{ck}$, and has an amplitude proportional to the current of the lowest-significant bit (LSB), $I_{LSB}$ (the current $I_{LSB}$ is also indicated in FIG. 1A above the DAC 106).

Figure 1C:
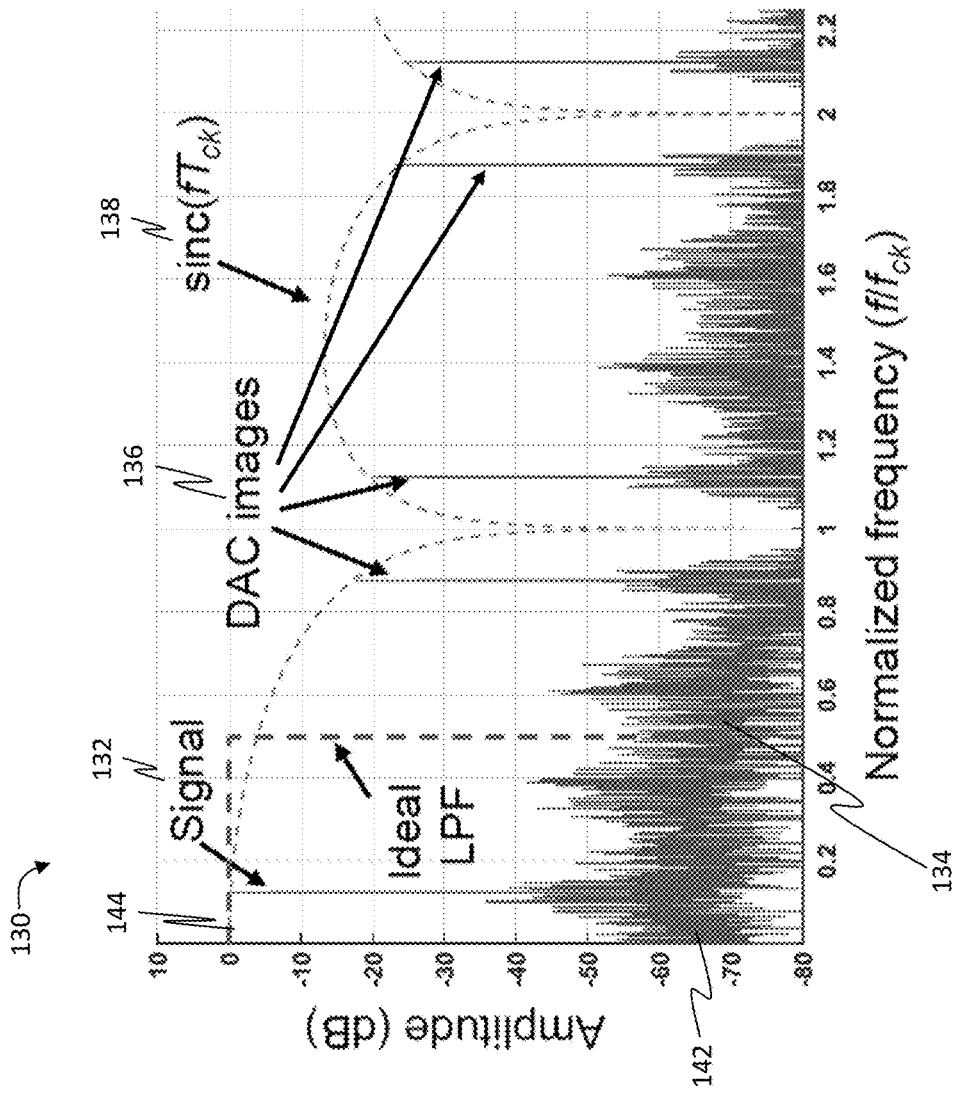
FIG. 1C is an illustration of an example DAC output spectrum with a sinc filter and an ideal low-pass filter magnitude response.

An example spectrum at the output of the DAC 106 is shown as a spectrum 130 of FIG. 1C. Such a spectrum may e.g. be obtained by applying a single-tone input at frequency $f_{in}$=0.125 Hz ($f_{ck}$=1 Hz) to the system of FIG. 1A with a quantizer resolution of 4 bits. As shown in FIG. 1C, the output spectrum 130 includes a signal component 132, broadband quantization error 134, and images/aliases 136 at $nf_{ck} \pm f_{in}$ (where n is an integer) created by the sampling operation in the quantizer 104. The NRZ pulse shape 122, as shown in FIG. 1B, of the DAC 106 provides a sinc filter transfer function, shaping the spectrum by $sinc(fT_{ck})$ 138, shown with a thin dashed line in FIG. 1C. This attenuates the images 136 and the high-frequency components of the quantization error 134 to some extent. The sinc transfer function has nulls at integer multiples of $f_{ck}$, and, therefore, it attenuates the DAC images 136 which are closer to the nulls more strongly compared to those which are not. If the images are not sufficiently attenuated, the amplitude of the residue $x_r(t)$ 116 at the output of the subtractor 110 in FIG. 1A is likely to overload the subsequent ADC stages. For example, in the case of an example CT pipelined ADC with a first-order low-pass residue amplifier AMP$_1$ 118 with a low-frequency gain (also referred to as "DC gain") of 8, the DAC images 136 have to be attenuated by at least 17 dB relative to the signal component 132 to keep the amplitude of the processed output residue signal 120 within reasonable limits. For the case of the NRZ DAC pulse (with the sinc filter), this requirement restricts the maximum input frequency, and hence the ADC input bandwidth, to $f_{ck}/8$. Conversely, for a given input bandwidth, $f_{BW}$, the ADC needs to be oversampled with an oversampling ratio (OSR) of at least 2. The oversampled nature of the digital output imposes a significant power penalty on the back-end digital processing blocks.

As the foregoing illustrates, improvements with respect to generating residue signals would be desirable.

Improved Residue Generation Systems

Embodiments of the present disclosure propose systems and methods for generating residue signals of a CT residue generation stage of an ADC based on the use of at least one stub filter that can filter the analog input before it is processed in the feedforward path so that the blockers can be attenuated before they are sampled and quantized in the feedforward path, thereby increasing blocker tolerance, especially important for blockers having frequency around $f_{ck}$ and multiples of $f_{ck}$. Residue signals generated when such a filter is used may simplify the design of the subsequent blocks of an ADC which process the residue signals, and may lower the power dissipation of the back-end digital processing blocks along with that of the CT residue generation system itself.

Figure 2:
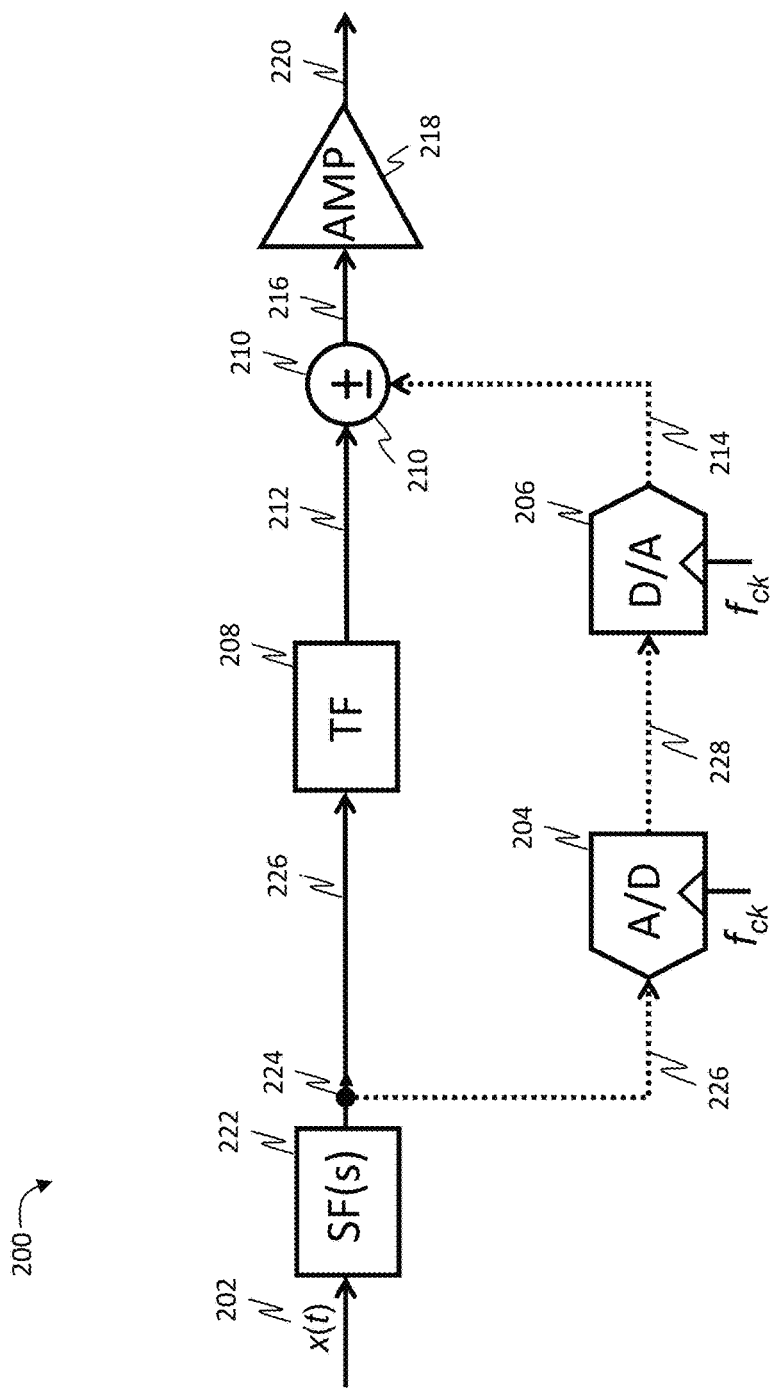
FIG. 2 is an illustrative system diagram of a residue generation system with one or more stub filters, according to some embodiments of the present disclosure.

FIG. 2 is an illustrative system diagram of a residue generation system with at least one stub filter, according to some embodiments of the present disclosure. The system 200 may be used as a residue generator in a CT stage of any of suitable multi-stage ADCs, such as e.g. CT, as well as hybrid ADCs, implemented in various types of architectures, such as e.g. pipelined ADCs, MASH ADCs, VCO ADCs, and other ADCs utilizing residue signals.

As shown in FIG. 2, a CT analog input, x(t), 202 is eventually sent to two different paths—a forward path, indicated in FIG. 2 with solid arrows, and a feedforward path, indicated in FIG. 2 with dotted arrows. In the following FIGURES, the feedforward path is indicated with solid arrows, since FIG. 2 clarifies for all of the present FIGS. which path is a forward path and which path is a feedforward path. As further shown in FIG. 2, the system 200 is similar to the system 100 shown in FIG. 1 in that it may include a quantizer 204 (labeled in FIG. 2 as "A/D" to indicate that analog-to-digital conversion takes place), a feedforward DAC 206 (labeled in FIG. 2 as "D/A" to indicate that digital-to-analog conversion takes place), a forward path transfer function (TF) 208 (which e.g. may be a delay), a subtractor 210, and an amplifier 218. In various embodiments of the present disclosure, unless described otherwise, these elements may be analogous to the quantizer 104, the feedforward DAC 106, the forward path transfer function 108, the subtractor 110, and the amplifier 118, respectively, as described with reference to FIG. 1. Similarly, FIG. 2 also shows an output 212 of the forward path transfer function 208, an output $x_q(t)$ 214 of the DAC 206, a residue signal $x_r(t)$ 216, and an amplified residue signal 220, analogous to, respectively, the output 112 of the forward path transfer function 108, the output $x_q(t)$ 114 of the DAC 106, the residue signal $x_r(t)$ 116, and the amplified residue signal 120, described with reference to FIG. 1. Unless stated otherwise, descriptions of elements of FIG. 1 that are analogous to corresponding elements shown in FIG. 2 are assumed to be applicable to FIG. 2 and, therefore, in the interests of brevity, are not repeated here in their entirety. Not specifically labeled in FIG. 1, but labeled in FIG. 2 is a digital output 228 provided from the quantizer 204 to the DAC 206.

In contrast to FIG. 1, the system 200 shown in FIG. 2 further includes one or more stub filters (SFs) 222, provided at an input 224 to the forward path and the feedforward path (namely, at an input to the forward path and the quantizer 204). While shown in FIG. 2 before the input node 224, in some embodiments, the one or more stub filters 222 may be considered to be implemented partially in the feedforward path and partially in the forward path. FIG. 2 further illustrates that the one or more stub filters 222 may modify the analog input 202 to generate a modified analog input 226, which is then provided to the feedforward path (e.g., to the quantizer 204), and is also provided to the forward path (e.g., to undergo the TF 208). Thus, as described in greater detail below, the output 226 used in the feedforward path is a filtered analog output that the one or more stub filters 222 are configured to generate based on the analog input 202, which filtered output is used by the quantizer 204 to generate the digital input 228 (e.g., an N-bit $f_{ck}$-rate output data) provided to the feedforward DAC 206, both the quantizer 204 and the DAC 206 being clocked with the clock signal $f_{ck}$, as schematically illustrated in FIG. 2. In turn, the feedforward DAC 206 will generate the feedforward path analog output 214 based on the digital input 228 generated by the quantizer 204, and the subtractor 210 will generate the residue signal 216 based on the feedforward path analog output 214.

Figure 3:
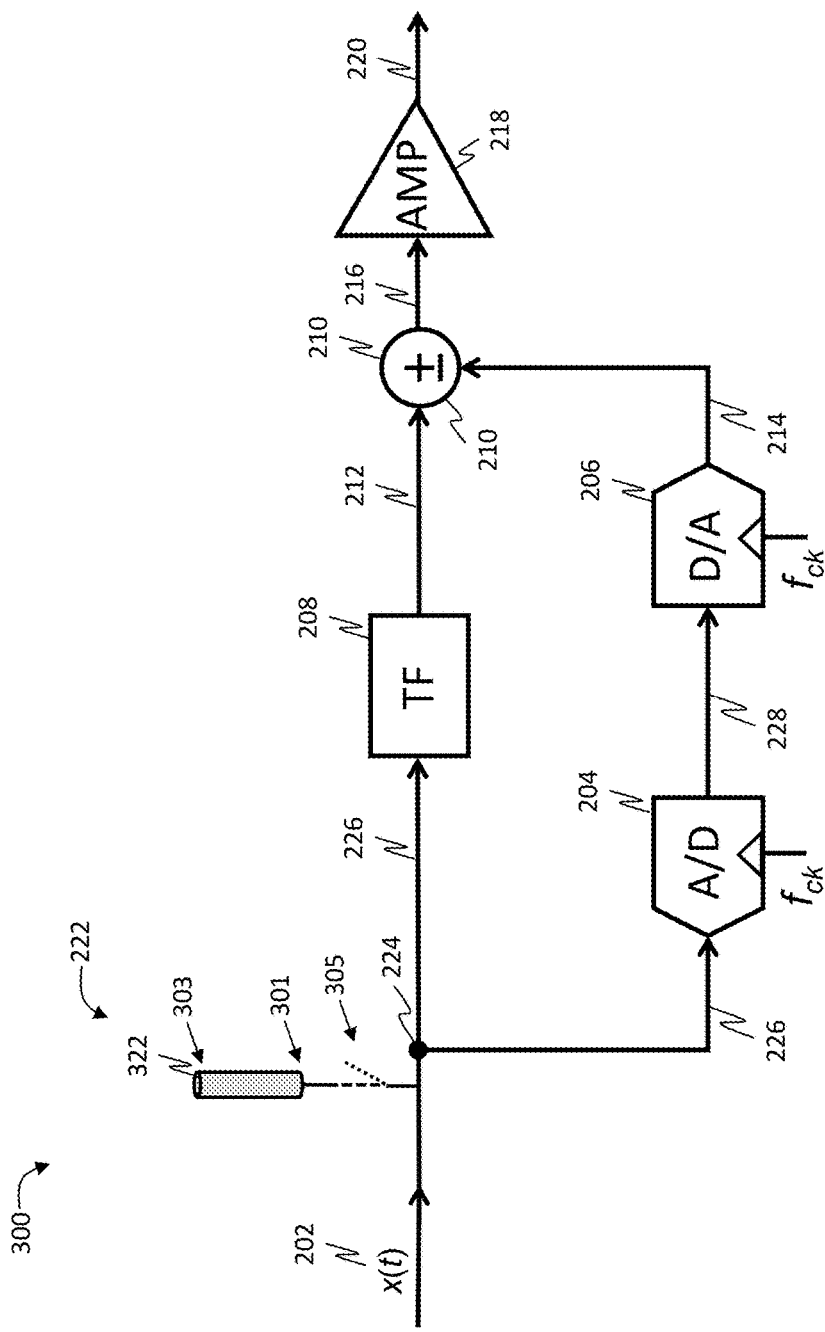
FIG. 3 is an illustrative system diagram of a residue generation system with a single stub filter and a switch, according to some embodiments of the present disclosure.
Figure 4:
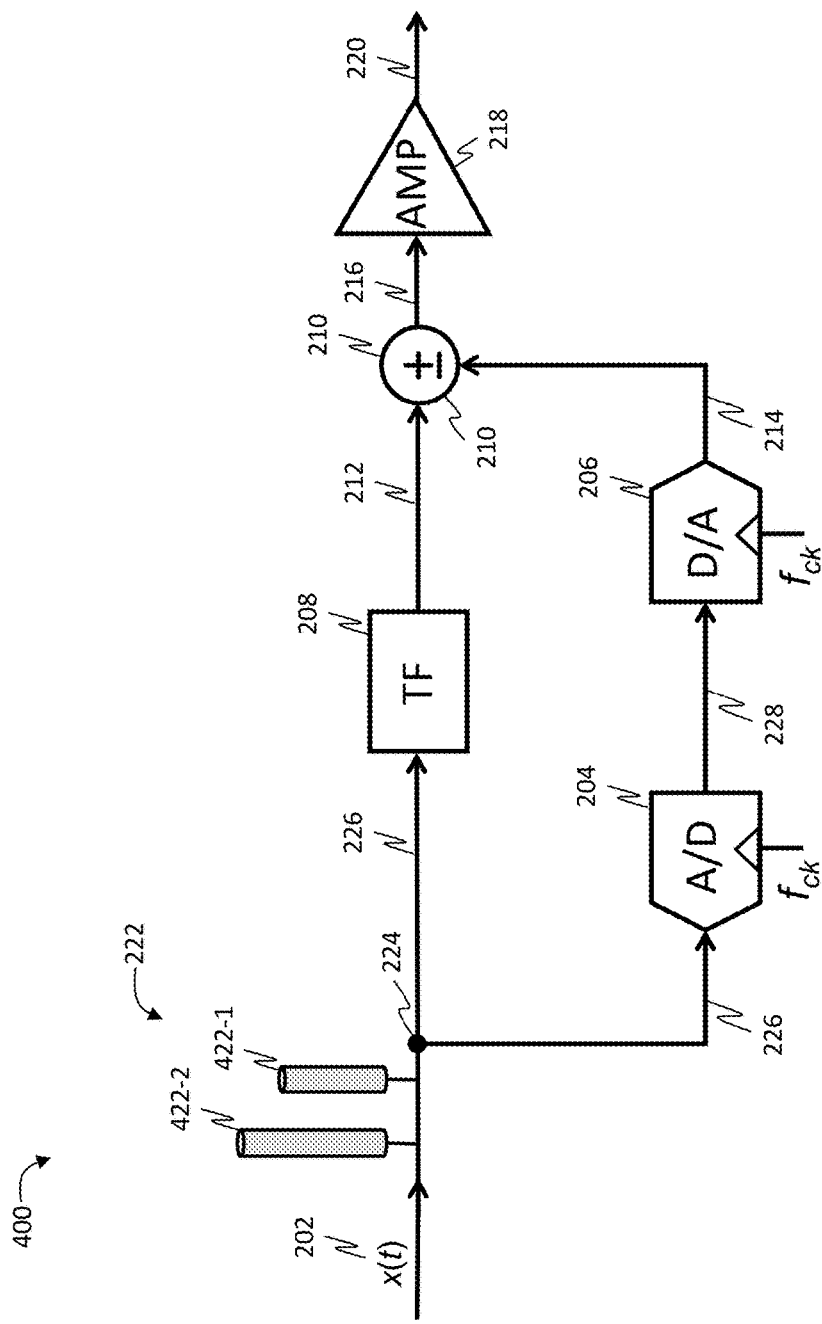
FIG. 4 is an illustrative system diagram of a residue generation system with two stub filters, according to some embodiments of the present disclosure.

A given stub filter 222, also sometimes referred to as a "stub" or a "resonant stub," is a portion of a transmission line or waveguide (i.e., a portion, or a stub, of an electrically conductive material) that is connected at one end only—e.g., the end 301 shown in FIG. 3. The other, free, end of the stub—e.g., the end 303 shown in FIG. 3, may be left open-circuit or be short-circuited. In various embodiments, any of the stub filters 222 may be implemented with any type of transmission line architectures, such as, but not limited to, coaxial cable, stripline, or parallel conductor line. Embodiments of the present disclosure are based on a realization that, in order to improve the blocker tolerance of a CT residue generation system, especially for inputs 202 having components around frequency $f_{ck}$ and multiples thereof, the analog input 202, which may contain blockers, may be modified to attenuated said blockers, before said analog input is quantized in a process that samples and aliases the input. Embodiments of the present disclosure are further based on the recognition that by properly designing the stubs 222, such elements may act as frequency-selective filters and may be configured to attenuate contents of the input signal 202 at various multiples of $f_{ck}$ (i.e., the one or more stub filters 222 may be designed to have notches at various multiples of $f_{ck}$), advantageously attenuating, or altogether substantially eliminating, at least some of the undesirable blockers. To that end, there are several manners in which the one or more stub filters 222 may be implemented, some of which are illustrated herein with reference to various example implementations of the system 200 as shown in FIGS. 3 and 4. In these FIGURES, elements having the same reference numerals as those shown in FIG. 2 are intended to illustrate analogous elements as those shown in FIG. 2 so that the descriptions provided for those elements with reference to FIG. 2 do not have to be repeated for each of FIGS. 3 and 4.

In some embodiments, the one or more stub filters 222 may include a single stub filter 222. An example of such a filter is shown as a stub filter 322 in FIG. 3. FIG. 3 illustrates a residue generation system 300, which one example of the residue generation system 200. As is shown in FIG. 3, the stub filter 322 may have a first end 301 and a second end 303. The first end 301 may be coupled to the input 224 to the forward path and the feedforward path. The second end 303 may be left open-circuit.

FIG. 3 further illustrates that, in some embodiments, the residue generation system 300 may include an optional switch 305, coupled between the first end 301 of the stub filter 322 and the input node 224. The switch 305 may include any suitable switching means having one or more states, where, depending on the state of the switch 305, the stub filter 322 may be either electrically connected to the input 224 and, thus, able to modify the analog input 202 to generate the modified analog input 226 to be provided to the forward and feedforward paths, or be disconnected from the input 224 and, thus, unable to make said modification to the analog input 202. FIG. 3 uses a dashed line to schematically illustrate a "closed" position of the switch 305, indicating that, in some embodiments, such a "closed switch" position may represent the state where the switch 305 connects the stub filter 322 to the input 224. FIG. 3 further shows a dotted line to schematically illustrate an "open" position of the switch 305, indicating that, in some embodiments, such an "open switch" position may represent the state where the switch 305 disconnects the stub filter 322 from the input 224.

Assuming that the stub filter 322 is connected to the input 224, a delay introduced by the stub filter 322 will affect which frequencies of the analog input signal 202 are attenuated. For example, in some embodiments, the stub filter 322 may be designed to have a delay of $T_{ck}/4$, where, again, $T_{ck}$ is a clock period of the clock driving the quantizer 204 and the feedforward DAC 206. In other words, the stub filter 322 may introduce a group delay of $T_{ck}/4$ into the feedforward path of the residue generation system 300. Such a stub filter would have notches at odd multiples of the $f_{ck}$ (i.e., such a single stub filter 322 would have notches at $f_{ck}$, $3f_{ck}$, $5f_{ck}$, etc.). This would advantageously attenuate blockers, within the input signal 202, at these odd multiples of the $f_{ck}$, resulting in the modified analog input signal 226. In other embodiments, the stub filter 322 may be designed to have a delay of $T_{ck}/2$ (in other words, the stub filter 322 may introduce a group delay of $T_{ck}/2$ into the feedforward path of the residue generation system 300), which would result in the stub filter 322 having notches at some even multiples of the $f_{ck}$ (i.e., such as single stub filter 322 would have notches at $2f_{ck}$, $6f_{ck}$, $10f_{ck}$, etc.). This would advantageously attenuate blockers, within the input signal 202, at these even multiples of the $f_{ck}$, resulting in the modified analog input signal 226. In some embodiments, the delay introduced by a given stub filter depends on, and therefore may be controlled by, the length of the conductive portion of the stub.

Figure 5:
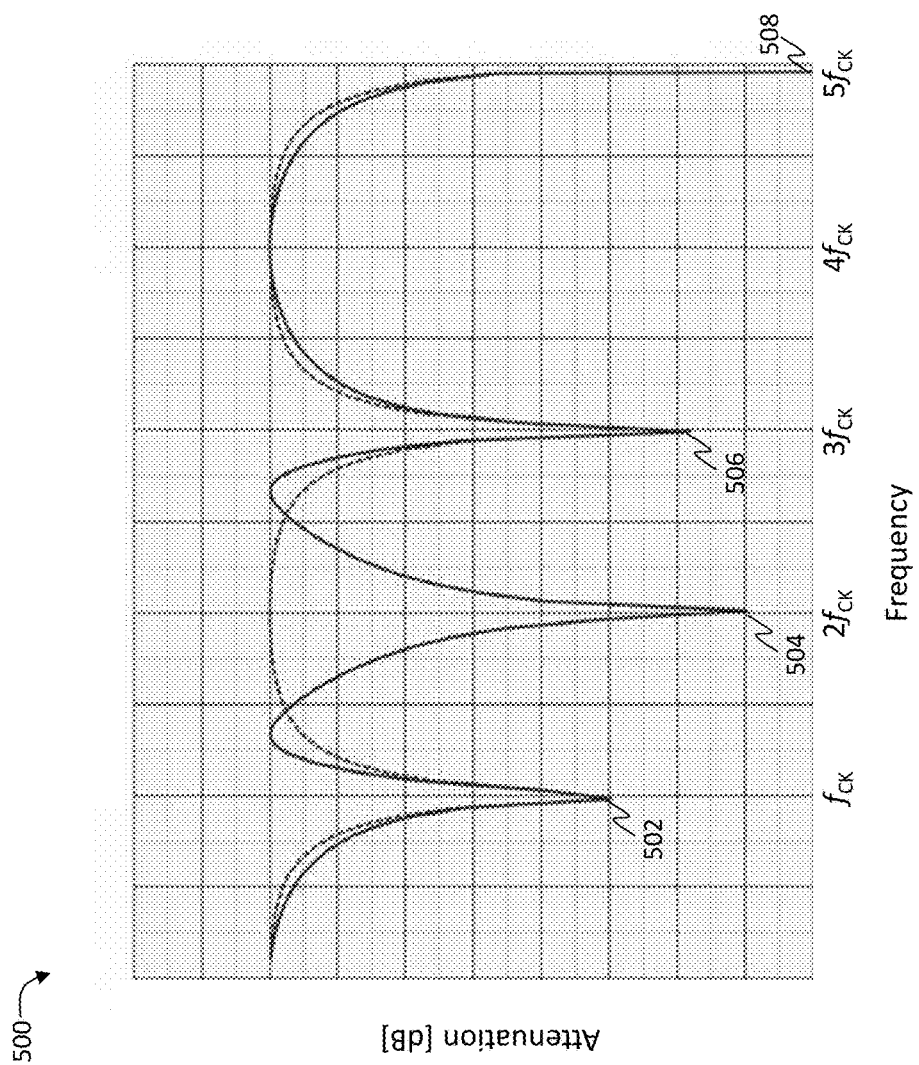
FIGS. 5-7 illustrate frequency response plots of one or more stub filters, according to various embodiments of the present disclosure.

In the embodiments where it may be desired that both, blockers at odd frequencies, and blockers at at least some even frequencies are attenuated, two stub filters may be used. Such an embodiment is illustrated in FIG. 4, showing a residue generation system 400 (which is an example of the residue generation system 200) with two stub filters 222, shown as a first stub filter 422-1 and a second stub filter 422-2. Although not specifically labeled in FIG. 4, in line with the explanations provided above, each of the stub filters 422 has one end coupled to the input 224 and one end that is left open-circuit. If one of the stub filters 422 is designed to have a delay of $0.25T_{ck}$, while the other one is designed to have a delay of $0.5T_{ck}$, then a combination of such filters would allow generating the modified input signal 226 in which signal components at frequencies $f_{ck}$, $2f_{ck}$, $3f_{ck}$, $5f_{ck}$, $6f_{ck}$, $7f_{ck}$, $9f_{ck}$, $10f_{ck}$, etc. are attenuated. FIG. 5 illustrates a plot 500 showing a frequency response of the stub filter 222 implemented as a single stub (dashed line) and a frequency response of the stub filter 222 implemented as two stubs (solid line). In FIG. 5, the horizontal axis illustrates frequencies, while the vertical axis illustrates attenuation. As can be seen in FIG. 5, the frequency response of a single stub (i.e., the dashed line shown in FIG. 5) has alias rejections/notches at $f_{ck}$ (point 502 shown in FIG. 5), $3f_{ck}$ (point 506 shown in FIG. 5), $5f_{ck}$ (point 508 shown in FIG. 5), and so on (further frequencies are not shown in FIG. 5), i.e., at odd multiples of $f_{ck}$. While this is helpful for improving blocker tolerance of the system, the second most important aliased band $2f_{ck}$ is still missing. Using two stub filters helps with that, where, as can also be seen in FIG. 5, the frequency response of a two-stub filter 222 (i.e., the solid line shown in FIG. 5) has alias rejections/notches at $f_{ck}$ (point 502 shown in FIG. 5), $2f_{ck}$ (point 504 shown in FIG. 5), $3f_{ck}$ (point 506 shown in FIG. 5), $5f_{ck}$ (point 508 shown in FIG. 5), and so on.

Although not specifically shown in FIG. 4, in further embodiments, additional stub filters may be added to attenuate signal components at still other frequencies, e.g., at $4f_{ck}$, $8f_{ck}$, etc.

Figure 6:
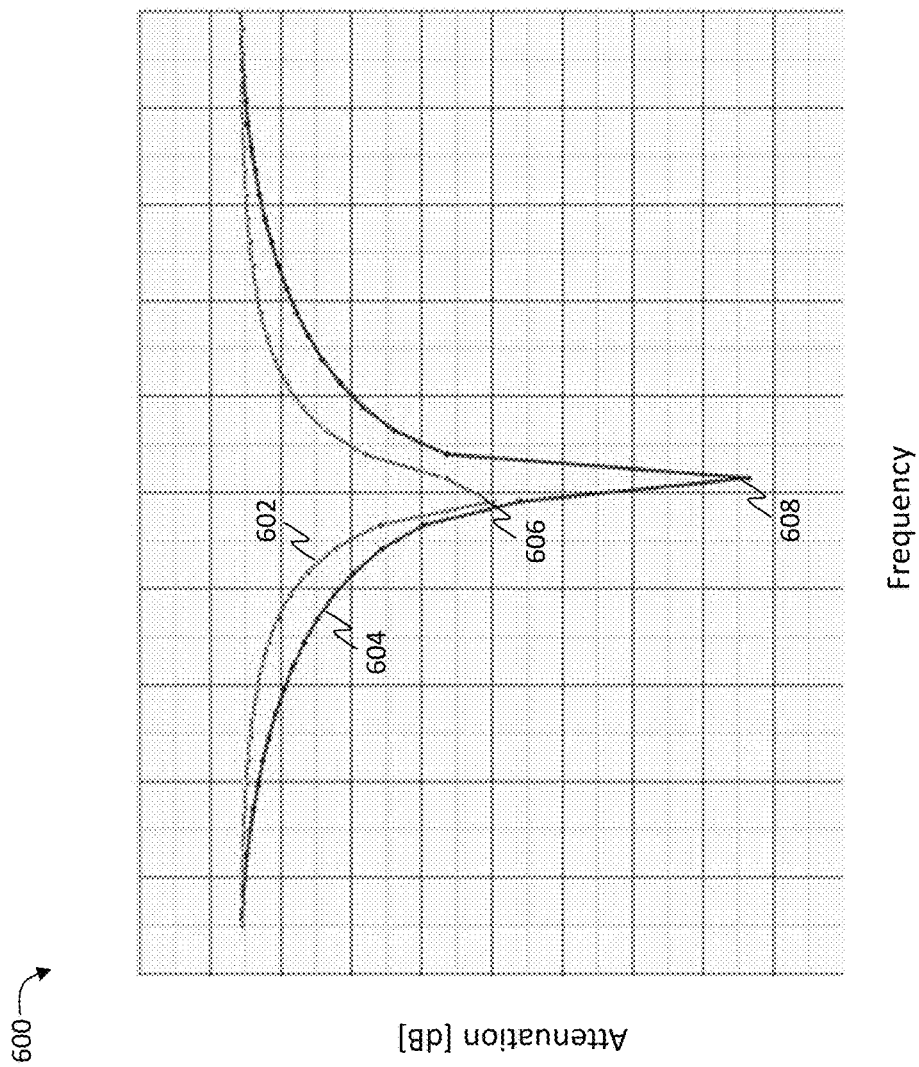

Furthermore, in some embodiments, multiple stub filters having the same delay may be implemented. For example, in some embodiments multiple stub filters each having a delay of $0.25T_{ck}$ may be implemented. Such embodiments may provide the advantage of increasing the attenuation at the notches of these stub filters, compared to a lesser number of filters. This is depicted in FIG. 6, illustrating a plot 600 where a frequency response of a single stub filter is shown with a line 602, and a combined frequency response of a pair of two stub filters designed to have the same delay (e.g., both stub filters configured to have notches at $f_{ck}$) shown with a line 604. The plot 600 illustrates that the maximum attenuation provided by the notch of the single stub filter, shown with a point 606 on the line 602, can be increased if a pair of stub filters is used, the maximum attenuation of the latter shown in FIG. 6 with a point 608 on the line 604. Similar to FIG. 5, in FIG. 6, the horizontal axis illustrates frequencies, while the vertical axis illustrates attenuation.

Thus, in general, in various embodiments of the present disclosure, any number of one or more stub filters 222, each of which connectable to the input 224, may be used to attenuate signal components at various multiples of $f_{ck}$. In the embodiments when multiple stub filters 222 are used, a resulting effect in the modified analog signal 226 is a linear combination of the effects of each individual filter. For example, implementing two filters 222 with a first filter having notches at odd multiples of the $f_{ck}$ (i.e., at $f_{ck}$, $3f_{ck}$, $5f_{ck}$, etc.) and with a second filter having notches at $2f_{ck}$, $6f_{ck}$, $10f_{ck}$, etc., would result in the combined filtering applied to the input signal 202 being such signals components at the combination of the notches of these two filters are attenuated, as explained above for the example of FIG. 4.

Furthermore, although not specifically shown in figures, in the embodiments when a plurality of stub filters 222 are implemented, a switching mechanism similar to that described with reference to FIG. 3 may be employed, to selectively switch on and off various ones of the stub filters 222 (i.e., various ones of the multiple stub filters 222 may be connected to, or disconnected from, the input 224 as desired for a particular implementation). Such a switching mechanism may advantageously enable the notches of the resulting filtering applied to the signal 202 to be programmable.

Figure 7:
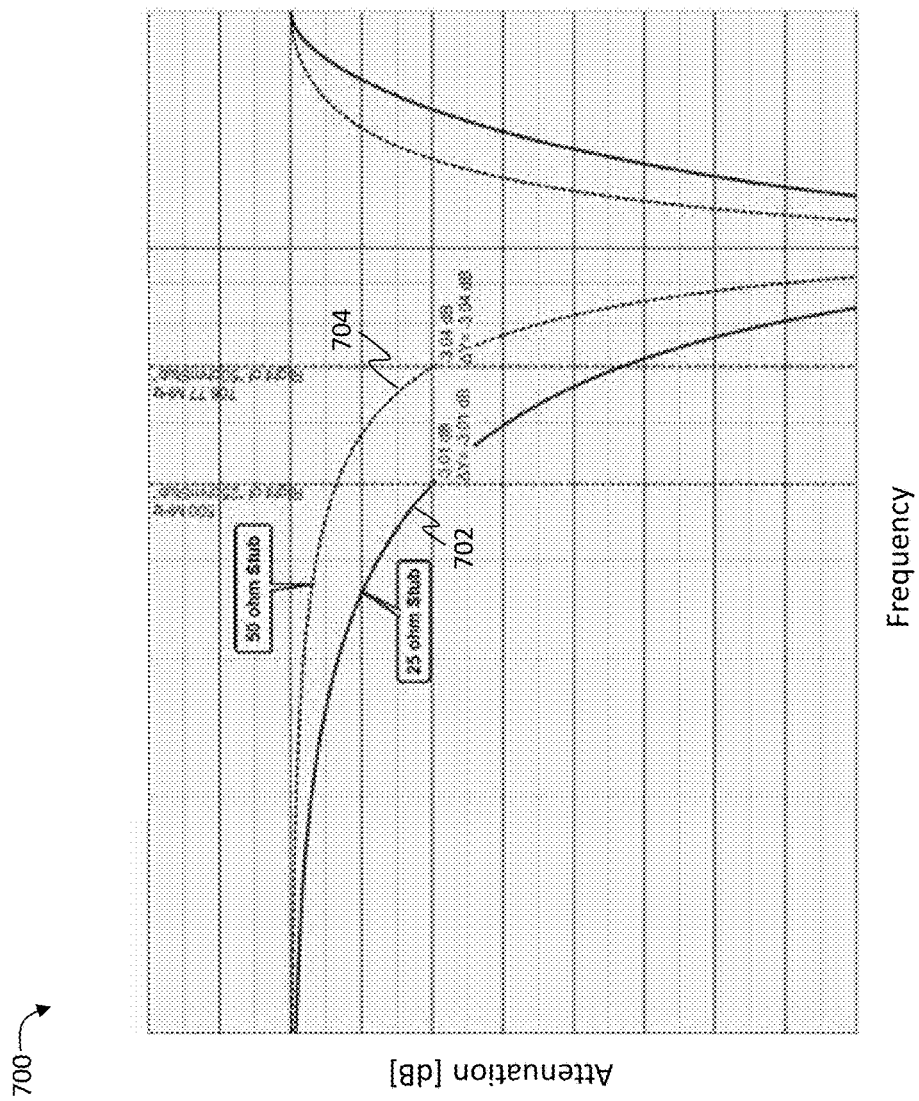

Still further, in various embodiments, impedance of each of the one or more stubs 222 may be selected to achieve desired width of the notch in the frequency spectrum. FIG. 7 illustrates that a width of a notch of a stub filter having one impedance, e.g., 25 Ohm (line 702 shown in FIG. 7) may be greater than a width of a notch of a stub filter having a larger impedance, e.g., 50 Ohm (line 704 shown in FIG. 7). Similar to FIG. 5, in FIG. 7, the horizontal axis illustrates frequencies, while the vertical axis illustrates attenuation. In some embodiments, the characteristic impedance of a transmission line based stub filter may be controlled by controlling (i.e., carefully selecting) certain design parameters such as the physical dimension(s) of the conducting material used to implement the stub, spacing of the conducting materials, the type of the non-conductive material used between the conductive materials, etc.

Example Method for Generating a Residue Signal

FIG. 8 is a flow diagram illustrating a method 800 for generating a residue signal using one or more stub filters as described herein, according to some embodiments of the present disclosure. The method may be used for any residue-generating ADC implementing at least one CT residue generation stage implementing a filter before quantization, as described herein. The method outlined is described for a particular residue generation element/system. It is envisioned by the disclosure that the same method can be applied to other residue generation systems that may be present within the ADC, e.g. to residue generation systems in other stages of conversion, to reduce negative effects of blockers with high amplitudes, as described herein.

As shown in FIG. 8, the method 800 may begin with step 802, in which one or more stub filters are applied to an analog input to generate a modified analog input ("input" to the rest of the residue generation system; or, viewed differently, to generate a filtered analog output because it is an "output" from the one or more stub filters). The one or more stub filters applied in step 802 may be any of the stub filters 222 described herein, which are configured to generate the modified analog input 226 based on the analog input 202.

In step 804, a digital input may be generated based on the modified analog input generated in step 802. Step 804 may be implemented using any of the quantizers 204 described herein, where the quantizer 204 would generate a digital input 228 for the feedforward DAC 206 by quantizing the modified analog input 226 of the one or more stub filters 222.

In step 806, a feedforward path analog output may be generated based on the digital input generated in step 804. Step 806 may be implemented using any of the DACs 206 described herein, where the DAC 206 would generate the feedforward path analog output 214 based on the digital input 228 generated by the quantizer 204.

In step 808, a residue signal may be generated based on the feedforward path analog output generated in step 806. The residue signal generated in step 808 may be either the residue signal 216 as described herein, generated based on the feedforward path analog output 214 as well as the forward path analog output 212 by the subtractor 210, or the amplified version of such a residue signal, i.e. the residue signal 220 generated by the amplifier 218.

Example Residue Generation Apparatus

In some embodiments, a residue generation apparatus may include a first stage comprising at least a residue generation circuit or system configured to generate a residue signal, and a second stage configured to process the residue signal received from the first stage. The residue signal of the first stage may be injected into the second stage for further processing there. For example, the residue signal may be digitized by the second stage.

The residue generation circuit of the first stage may include means for digitizing an analog input to generate a digital output. Examples of such means include quantizers described herein, with an analog input provided to the quantizers being a filtered analog output of any of the stub filters (i.e., modified analog input) described herein. The first stage may further include means for amplifying and/or filtering the residue signal before it is provided to the second stage. Examples of such means include inter-stage amplifiers described herein, e.g. the amplifiers shown in FIGS. 2-4.

The apparatus can be a CT or a hybrid ADC, implementing at least one residue generation stage/system implemented as described with reference to any one of FIGS. 2-4.

SELECT EXAMPLES

The following paragraphs provide various select examples of the embodiments disclosed herein.

Example 1 provides a residue generation system for use in a CT stage of an ADC, the system including a forward path, a feedforward path that includes a quantizer, and one or more stub filters provided at an input to the forward path and the quantizer.

Example 2 provides the residue generation system according to example 1, where the one or more stub filters are configured to generate a modified analog input by modifying an analog input to the residue generation system.

Example 3 provides the residue generation system according to examples 1 or 2, further including a feedforward DAC (included in the feedforward path) and a subtractor.

Example 4 provides the residue generation system according to example 3, where the quantizer is configured to digitize the modified analog input to generate a digital output, the feedforward DAC is configured to generate a feedforward path analog output based on the digital output from the quantizer, the forward path is configured to apply a forward path transfer function to the modified analog input to generate a forward path analog output, and the subtractor is configured to generate a residue signal based on the forward path analog output and the feedforward path analog output.

Example 5 provides the residue generation system according to any one of the preceding examples, where each of the one or more stub filters is a transmission line portion, connected at one end only.

Example 6 provides the residue generation system according to example 5, where, for each of the one or more stub filters, an end that is not connected (i.e., the free end) is an open-circuit end.

Example 7 provides the residue generation system according to any one of the preceding examples, further including switching means configured to switch between a first state and a second state. When the switching means are in the first state, the one or more stub filters are electrically connected to the input to the forward path and the quantizer (i.e., are able to modify the analog input to the residue generation system to generate the modified analog input for the quantizer and the forward path). When the switching means are in the second state, the one or more stub filters are electrically disconnected from the input to the forward path and the quantizer (i.e., are not able to modify the analog input to the residue generation system, so that the analog input is provided to the forward path and the quantizer without being modified by the one or more stub filters).

Example 8 provides the residue generation system according to any one of the preceding examples, where the one or more stub filters include a plurality of stub filters, and the system further includes switching means, configured to selectively connect and disconnect (electrical connections) any of the plurality of stub filters to the input to the forward path and the quantizer. When a given stub filter is connected to the input to the forward path and the quantizer, it is able to modify the analog input to the residue generation system so that a modified analog input is provided to the quantizer and the forward path. When a given stub is disconnected from the forward path and the quantizer, it is unable to make said modification.

Example 9 provides the residue generation system according to any one of examples 1-8, where the one or more stub filters include a single stub filter.

Example 10 provides the residue generation system according to example 9, where the single stub filter is designed to have a propagation delay of substantially $0.25/f_{ck}$ (or of substantially $T_{ck}/4$), where $f_{ck}$ is a clock rate in the feedforward path (i.e., a clock rate, or sampling rate/frequency of the clock driving the quantizer and the feedforward DAC), and where $T_{ck}=1/f_{ck}$.

Example 11 provides the residue generation system according to examples 9 or 10, where the single stub filter is configured for modifying the analog input to the residue generation system by attenuating, within the analog input, signals at odd multiples of the $f_{ck}$ (i.e., the single stub filter may have notches at $f_{ck}$, $3f_{ck}$, $5f_{ck}$, etc.).

Example 12 provides the residue generation system according to example 9, where the single stub filter is designed to have a propagation delay of substantially $0.5/f_{ck}$ (or of substantially $T_{ck}/2$), where $f_{ck}$ is a clock rate in the feedforward path (i.e., a clock rate, or sampling rate/frequency of the clock driving the quantizer and the feedforward DAC), and where $T_{ck}=1/f_{ck}$.

Example 13 provides the residue generation system according to examples 9 or 12, where the single stub filter is configured for modifying the analog input to the residue generation system by attenuating, within the analog input, signals at one or more (some, not all) even multiples of the fs (i.e., the single stub filter may have notches at $2f_{ck}$, $6f_{ck}$, $10f_{ck}$, etc.).

Example 14 provides the residue generation system according to any one of examples 1-8, where the one or more stub filters include at least a first stub filter and a second stub filter.

Example 15 provides the residue generation system according to example 14, where the first stub filter is configured for modifying the analog input to the residue generation system by attenuating, within the analog input, signals at odd multiples of a clock rate in the feedforward path, $f_{ck}$ (i.e., the first stub filter may have notches at $f_{ck}$, $3f_{ck}$, $5f_{ck}$, etc.), and the second stub filter is configured for modifying the analog input to the residue generation system by attenuating, within the analog input, signals at one or more (some, not all) even multiples of the clock rate in the feedforward path (i.e., the second stub filter may have notches at $2f_{ck}$, $6f_{ck}$, $10f_{ck}$, etc.).

Example 16 provides the residue generation system according to examples 14 or 15, where a length of the first stub filter is different from a length of the second stub filter.

Example 17 provides the residue generation system according to any one of examples 14-16, where an impedance of the first stub filter is different from an impedance of the second stub filter. Provided all other parameters of stub filters are equal, different stub filters having different impedances results in different stub filters having different width of their notches (i.e., by changing the characteristic impedance of a stub filter, the steepness of its' notches may be controlled).

Example 18 provides a residue generation system for use in a CT stage of an ADC, the system including one or more stub filters for generating a modified analog input based on an analog input; a quantizer for generating a digital input to a feedforward DAC based on the modified analog input; the feedforward DAC for generating a feedforward path analog output based on the digital input generated by the quantizer; and a subtractor for generating a residue signal based on the feedforward path analog output.

Example 19 provides the residue generation system according to example 18, further including a forward path, used to generate a forward path analog output based on the modified analog input, where the subtractor is for generating the residue signal based on the feedforward path analog output and the forward path analog output.

Example 20 provides an ADC that includes a first stage and a second stage. The first stage includes a residue generation system, having a forward path, a feedforward path, one or more stub filters provided at an input to the forward path and the feedforward path, and means for generating a residue signal based on an output from the forward path and an output from the feedforward path. The second stage is configured to process the residue signal received from the first stage.

Example 21 provides the ADC according to example 20, where the first stage is a CT stage.

Example 22 provides the ADC according to example 21, where the second stage is a DT stage.

Example 23 provides the ADC according to any one of examples 20-22, where the residue generation system is a residue generation system according to any one of examples 1-19.

Example 24 provides a method for generating a residue signal in a residue generation ADC, the method including: applying one or more stub filters to generate a modified analog input based on an analog input, the one or more stub filters configured to attenuate signals outside of a bandwidth of interest; generating a digital input based on the modified analog input; generating a feedforward path analog output based on the digital input; and generating the residue signal based on the feedforward path analog output.

OTHER IMPLEMENTATION NOTES, VARIATIONS, AND APPLICATIONS

In one example embodiment, any number of electrical circuits of the FIGS. may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGS. may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an integrated circuit (IC) that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the digital filters may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of filters (including the number of filter taps), delay elements, converters, processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular arrangements of components. Various modifications and changes may be made to such embodiments without departing from the scope of the appended claims. The description and drawings are, accordingly, to be regarded in an illustrative rather than in a restrictive sense.

The described architecture for generating residue signals to be provided to subsequent stages of an ADC are particularly suitable for high-speed, CT, high precision applications where residue-generating ADCs are used. Applications which can greatly benefit from the architecture include: instrumentation, testing, spectral analyzers, military purposes, radar, wired or wireless communications, mobile telephones (especially because standards continue to push for higher speed communications), and base stations.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the figures may be combined in various possible configurations, all of which are clearly within the broad scope of the present disclosure. In certain cases, it may be easier to describe one or more of the functionalities of a given set of flows by only referencing a limited number of electrical elements. It should be appreciated that the electrical circuits of the figures showing various embodiments of residue generation using a filter before quantization, and its teachings, are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in the present disclosure, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to residue generation, e.g. those summarized in the process shown in FIG. 8, illustrate only some of the possible functions that may be executed by, or within, the residue generation systems described with reference to FIGS. 2-4. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. Note that all optional features of the apparatus described above may also be implemented with respect to the method or process described herein and specifics in the examples may be used anywhere in one or more embodiments.

The invention claimed is:

1. A residue generation system for use in a continuous-time stage of an analog-to-digital converter (ADC), the system comprising:
  a forward path;
  a feedforward path, comprising a quantizer; and
  one or more stub filters at an input to the forward path and the quantizer.

2. The residue generation system according to claim 1, wherein the one or more stub filters are configured to generate a modified analog input by modifying an analog input to the residue generation system.

3. The residue generation system according to claim 1, further comprising a digital-to-analog converter (DAC) and a subtractor.

4. The residue generation system according to claim 3, wherein:
  the quantizer is configured to digitize the modified analog input to generate a digital output,
  the DAC is configured to generate a feedforward path analog output based on the digital output from the quantizer, the forward path is configured to apply a forward path transfer function to the modified analog input to generate a forward path analog output, and the subtractor is configured to generate a residue signal based on the forward path analog output and the feedforward path analog output.

5. The residue generation system according to claim 1, wherein each of the one or more stub filters is a transmission line, connected at one end only.

6. The residue generation system according to claim 5, wherein, for each of the one or more stub filters, an end that is not connected is an open-circuit end.

7. The residue generation system according to claim 1, further comprising switching means configured to switch between a first state and a second state,
wherein:
when the switching means are in the first state, the one or more stub filters are connected to the input to the forward path and the quantizer, and
when the switching means are in the second state, the one or more stub filters are disconnected from the input to the forward path and the quantizer.

8. The residue generation system according to claim 1, wherein the one or more stub filters include a plurality of stub filters, and the system further includes switching means, configured to selectively connect and disconnect any of the plurality of stub filters to the input to the forward path and the quantizer.

9. The residue generation system according to claim 1, wherein the one or more stub filters include a single stub filter.

10. The residue generation system according to claim 1, wherein the one or more stub filters include a stub filter designed to have a propagation delay of $0.25/f_{ck}$, where $f_{ck}$ is a clock rate in the feedforward path.

11. The residue generation system according to claim 1, wherein the one or more stub filters include a stub filter configured for attenuating signals at odd multiples of the $f_{ck}$.

12. The residue generation system according to claim 1, wherein the one or more stub filters include a stub filter designed to have a propagation delay of $0.5/f_{ck}$, where $f_{ck}$ is a clock rate in the feedforward path.

13. The residue generation system according to claim 1, wherein the one or more stub filters include a stub filter configured for attenuating signals at one or more even multiples of the fs.

14. The residue generation system according to claim 1, wherein the one or more stub filters include at least a first stub filter and a second stub filter.

15. The residue generation system according to claim 14, wherein:
the first stub filter is configured for attenuating signals at odd multiples of a clock rate in the feedforward path, $f_{ck}$), and
the second stub filter is configured for attenuating signals at one or more even multiples of the clock rate in the feedforward path.

16. The residue generation system according to claim 14, wherein a length of the first stub filter is different from a length of the second stub filter.

17. The residue generation system according to claim 14, wherein an impedance of the first stub filter is different from an impedance of the second stub filter.

18. A residue generation system for use in a continuous-time stage of an analog-to-digital converter (ADC), the system comprising:

one or more stub filters for generating a modified analog input based on an analog input;

a quantizer for generating a digital input to a digital-to-analog converter (DAC) based on the modified analog input;

the DAC for generating a feedforward path analog output based on the digital input generated by the quantizer; and a subtractor for generating a residue signal based on the feedforward path analog output.

19. The residue generation system according to claim 18, further comprising:
a forward path, used to generate a forward path analog output based on the modified analog input,
wherein the subtractor is for generating the residue signal based on the feedforward path analog output and the forward path analog output.

20. A method for generating a residue signal in a residue-generating analog-to-digital converter, the method comprising:

applying one or more stub filters to generate a modified analog input based on an analog input, the one or more stub filters configured to attenuate signals outside of a bandwidth of interest;

generating a digital input based on the modified analog input;

generating a feedforward path analog output based on the digital input; and generating the residue signal based on the feedforward path analog output.

21. The method according to claim 20, wherein the one or more stub filters include a plurality of stub filters, and the method further includes selectively connecting and disconnecting any of the plurality of stub filters to an input to a forward path and the feedforward path to generate the modified analog input.

22. The method according to claim 20, wherein the one or more stub filters include one or more of:
a stub filter designed to have a propagation delay of $0.25/f_{ck}$, where $f_{ck}$ is a clock rate in the feedforward path,
a stub filter configured for attenuating signals at odd multiples of the $f_{ck}$,
a stub filter designed to have a propagation delay of $0.5/f_{ck}$, where $f_{ck}$ is a clock rate in the feedforward path, and
a stub filter is configured for attenuating signals at one or more even multiples of the fs.

23. An analog-to-digital converter (ADC), comprising:
a first stage, comprising a residue generation system that includes:
a forward path,
a feedforward path, comprising a quantizer,
one or more stub filters at an input to the forward path and the quantizer, and
means for generating a residue signal based on an output from the forward path and an output from the feedforward path; and
a second stage configured to process the residue signal received from the first stage.

24. The ADC according to claim 23, wherein the first stage is a continuous-time stage.

25. The ADC according to claim 24, wherein the second stage is a discrete-time stage.

26. The ADC according to claim 23, wherein the one or more stub filters include a plurality of stub filters, and the first stage further includes switching means, configured to selectively connect and disconnect any of the plurality of stub filters to the input to the forward path and the quantizer.

27. The ADC according to claim 23, wherein the one or more stub filters include one or more of:
- a stub filter designed to have a propagation delay of $0.25/f_{ck}$, where $f_{ck}$ is a clock rate in the feedforward path,
- a stub filter configured for attenuating signals at odd multiples of the $f_{ck}$,
- a stub filter designed to have a propagation delay of $0.5/f_{ck}$, where $f_{ck}$ is a clock rate in the feedforward path, and
- a stub filter is configured for attenuating signals at one or more even multiples of the fs.

* * * * *

UNITED STATES PATENT AND TRADEMARK OFFICE
CERTIFICATE OF CORRECTION

| | | |
|---|---|---|
| PATENT NO. | : 10,361,711 B1 | |
| APPLICATION NO. | : 16/219198 | |
| DATED | : July 23, 2019 | |
| INVENTOR(S) | : Shanthi Pavan Yendluri et al. | |

It is certified that error appears in the above-identified patent and that said Letters Patent is hereby corrected as shown below:

On the Title Page

Item (73), delete "ANALOG DEVICES GLOBAL UNLIMITED COMPANY, Hamilton (BM)" and insert -- "ANALOG DEVICES INTERNATIONAL UNLIMITED COMPANY, Limerick (IE)" --.

Signed and Sealed this
Twenty-second Day of September, 2020

Andrei Iancu
*Director of the United States Patent and Trademark Office*